(12) United States Patent
Muller et al.

(10) Patent No.: US 6,291,353 B1
(45) Date of Patent: Sep. 18, 2001

(54) LATERAL PATTERNING

(75) Inventors: K. Paul Muller, Wappingers Falls; Hon-Sum P. Wong, Chappaqua, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/377,246

(22) Filed: Aug. 19, 1999

(51) Int. Cl.[7] .................................................. H01L 21/76
(52) U.S. Cl. ........................... 438/700; 438/637; 438/639
(58) Field of Search .................................... 438/637, 638, 438/639, 640, 670, 675, 700

(56) References Cited

U.S. PATENT DOCUMENTS 4,690,729 * 9/1987 Douglas ................................ 438/700
5,369,053 * 11/1994 Fang ..................................... 438/637
6,054,384 * 11/2000 Wang et al. .......................... 438/700

FOREIGN PATENT DOCUMENTS

337039 * 7/1998 (TW) .

* cited by examiner

Primary Examiner—Charles Bowers
Assistant Examiner—Yennhu B. Huynh
(74) Attorney, Agent, or Firm—McGinn & Gibb, PLLC; Marian Underweiser, Esq.

(57) ABSTRACT

A method and structure for forming an integrated circuit chip having at least one opening in a substrate includes forming an opening having vertical walls in the substrate, protecting a first portion of the vertical walls of the opening, leaving a second portion of the vertical walls unprotected, and laterally patterning the second portion of the opening to change a shape or property of the opening.

20 Claims, 10 Drawing Sheets

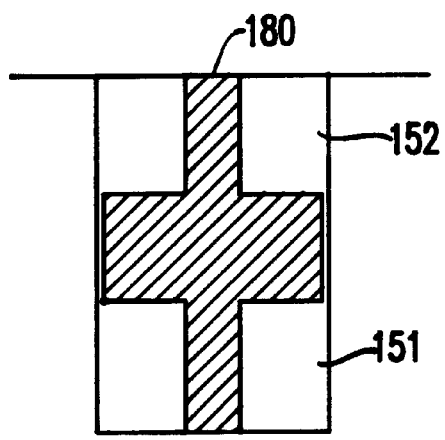
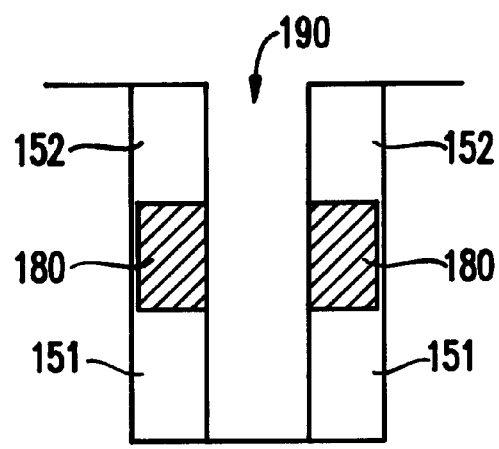
FIG.18  FIG.19
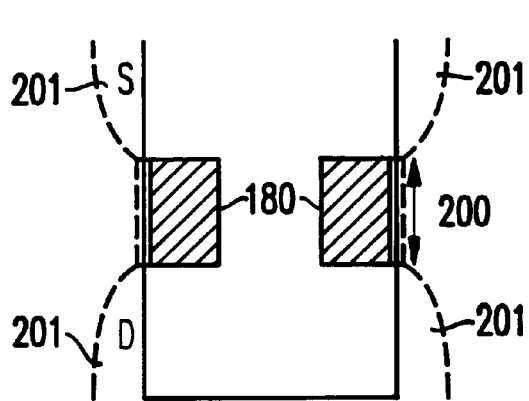
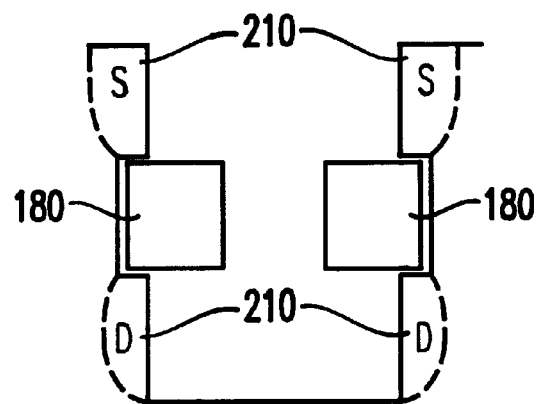
FIG.20  FIG.21

LATERAL PATTERNING

BACKGROUND OF THE INVENTION

1. Field of the Invention

The present invention generally relates to the formation of self-aligned structures in integrated circuit devices and more particularly to generating a lateral mask followed by lateral etching, deposition, diffusion or epitaxy.

2. Description of the Related Art

Spacers are broadly used in the conventional formation of integrated circuit devices. The spacers are self-aligned structures generated laterally adjacent to an existing structure. The spacers can be used as a mask for vertical processing (e.g., as etch masks or implant masks).

However, conventional processing is limited to the formation of vertical features/structures self-aligned with the spacers. This limits the designers ability to form structures laterally. The invention overcomes this problem as discussed below.

SUMMARY OF THE INVENTION

It is, therefore, an object of the present invention to provide a structure and method for forming an integrated circuit chip having at least one opening in a substrate which includes forming an opening having vertical walls in the substrate, protecting a first portion of the vertical walls of the opening, leaving a second portion of the vertical walls unprotected, and laterally processing the second portion of the opening to change the shape of the opening. The laterally processing can include an isotropic wet etch, an isotropic dry etch or an anisotropic wet etch, selective deposition processes, selective epitaxial processes, or diffusion. The protecting includes forming a mask over the first portion of the vertical walls. The first portion can be the upper or lower portion of the opening. The first portion and the second portion can be alternating portions along a depth of the opening.

A second embodiment of the invention is a structure and method of forming an integrated circuit chip having at least one opening in a substrate which includes forming an opening having vertical walls in the substrate, protecting a first portion of the vertical walls of the opening, leaving a second portion of the vertical walls unprotected, and laterally patterning the second portion of the opening to form a step in the opening.

A third embodiment of the invention is a method of forming an integrated circuit chip having at least one transistor which includes forming an opening having vertical walls in a semiconductor substrate, protecting a first portion of the vertical walls of the opening, leaving a second portion of the vertical walls unprotected, laterally patterning the second portion of the opening to form a step in the opening, and doping selected portions of the step to form two conductive regions separated by a semiconductive region. In the presence of an adjacent voltage field, the semiconductive region changes its conductivity and performs a switching operation in combination with the conductive regions.

Yet another embodiment of the invention is a method of forming an integrated circuit chip having at least one opening in a substrate which includes forming an opening having vertical walls in the substrate, protecting first portions of the vertical walls of the opening, leaving second portions of the vertical walls unprotected, wherein the first portions alternate with the second portions, and laterally etching the second portions of the opening to change a shape or property of the opening.

A further embodiment is an integrated circuit having at least one trench capacitor where the trench capacitor includes an opening having vertical sides, the vertical sides including a plurality of lateral openings, an insulator lining the opening and a conductor filling the opening. The lateral openings can be rectangular, v-shaped or curved openings in cross-section. The lateral openings increase a surface area and capacitance of the trench capacitor.

The invention is superior to conventional formation techniques because it allows for self-aligned patterning in the third dimension (i.e., laterally). Also, the size of the structures can be easily adjusted by altering of the depth of the sacrificial and/or mask material, as discussed above. The depositions of the masking and sacrificial materials can be controlled much more precisely with the invention than with conventional lithographic techniques. This is especially true when the dimensions of the structures decrease.

BRIEF DESCRIPTION OF THE DRAWINGS

The foregoing and other objects, aspects and advantages will be better understood from the following detailed description preferred embodiments of the invention with reference to the drawings, in which:

FIG. 18 is a schematic diagram of yet another stage of generation of vertical transistors according to the invention;

FIG. 19 is a schematic diagram of the next phase of generation of vertical transistors according to the invention;

FIG. 20 is a schematic diagram of the finished devices after generation of vertical transistors according to the invention;

FIG. 21 is another schematic diagram of the finished devices;

DETAILED DESCRIPTION OF PREFERRED EMBODIMENTS OF THE INVENTION

Figure 1:
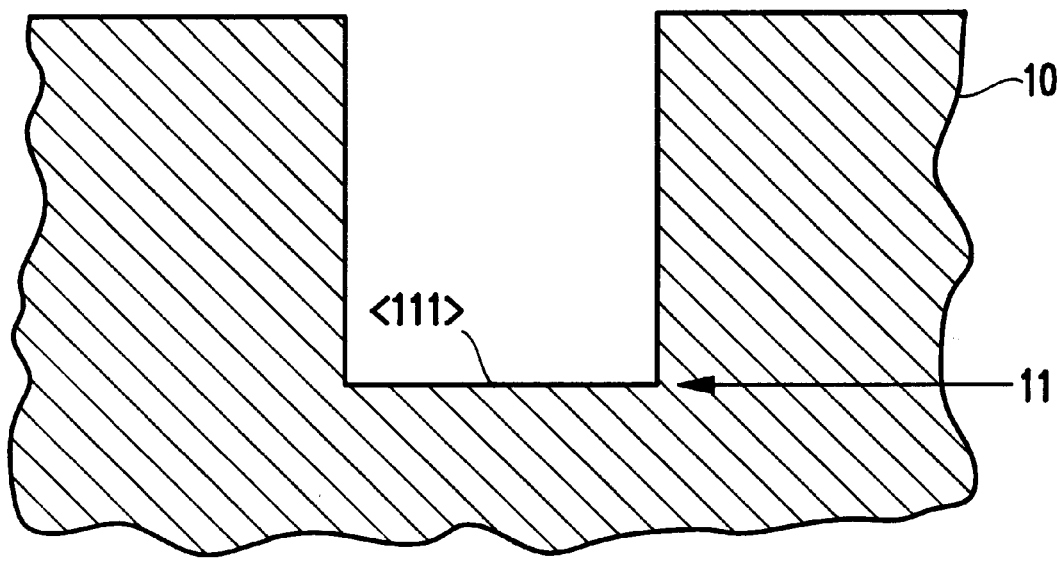
FIG. 1 is a schematic diagram of a partially formed structure according to the invention.

Referring now to the drawings, and more particularly to FIGS. 1–4, an embodiment of the invention is illustrated. FIG. 1 illustrates a substrate 10 which can be a conductor, insulator or semiconductor. In a preferred example, the substrate 10 is a mono-crystalline silicon insulator. An opening 11 is formed in the substrate 10 using any of a wide variety of conventional methods, such as masking and etching processes.

Figure 2:
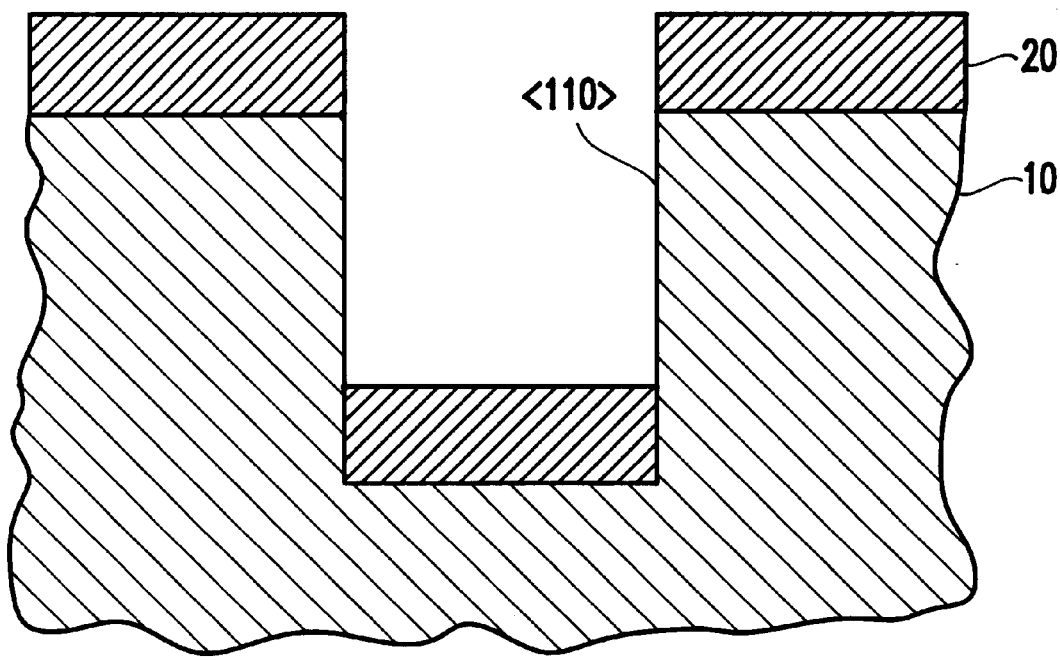
FIG. 2 is a schematic diagram of a partially formed structure according to the invention.

FIG. 2 illustrates a masking material 20 formed on the horizontal surfaces of the substrate 10. The masking material can comprise any conventional masking substance (such as an oxide, nitride, etc.). The masking material 20 can be deposited to be formed only on the horizontal surfaces of the substrate 10 using, for example, a mixture of silane, oxygen and argon gases in a high density plasma reactor.

Figure 3:
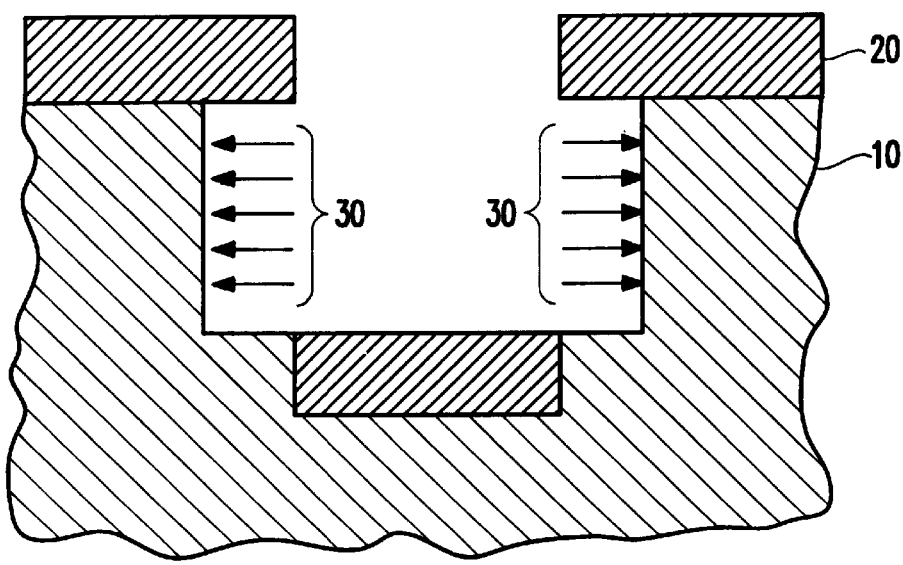
FIG. 3 is a schematic diagram of a partially formed structure according to the invention.

In FIG. 3, the inventive lateral patterning process is performed. This process involves an isotropic wet or dry etch or an anisotropic wet etch. The chemical composition of the etching solution used can comprise any conventional etching agent, such as $H_3PO_4$ for an isotropic etch of $Si_3N_4$, F (from $NF_3$) for an isotropic etch of Si in a chemical dry etch, and is preferably $NH_4OH$ for an anisotropic etch of Si. This process selectively removes material from the vertical surfaces (e.g., 110) of the substrate 10 as shown by the arrows 30 in FIG. 3. Selectivities of several hundreds to one are possible.

The masking material 20 is then removed using a selective solution which dissolves the mask material 20 but does not affect the substrate material 10. The selective solution can comprise any conventional dissolving solution, such as a HF containing solution and preferably comprises 40:1 diluted HF.

Figure 4A:
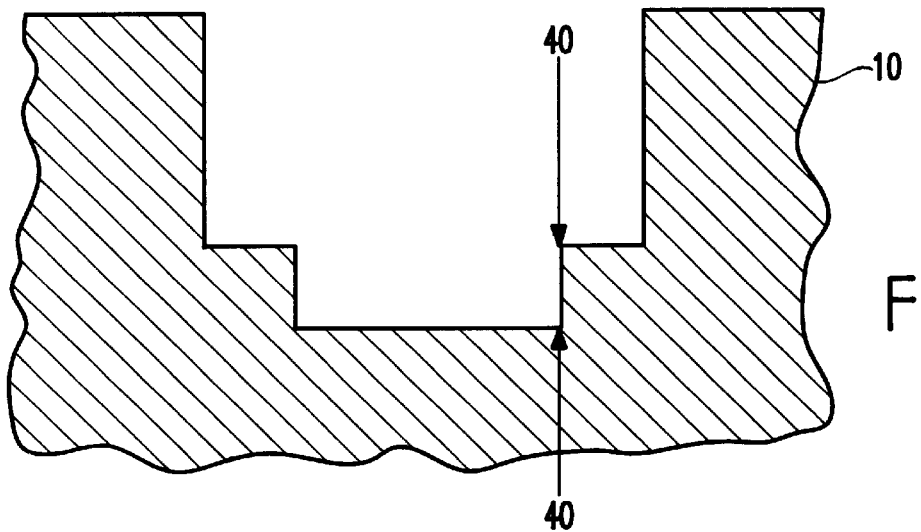
FIG. 4A is a schematic diagram of a structure according to the invention.
Figure 4B:
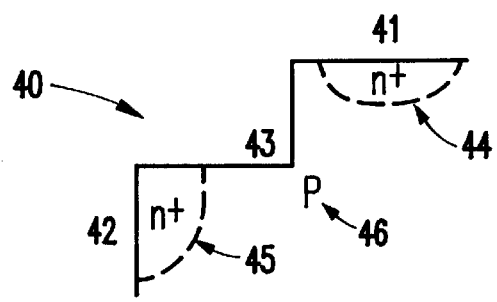
FIG. 4B is a schematic diagram of a partially vertical transistor.

The remaining structure, shown in FIG. 4A, includes a step 40 which can be advantageously used in subsequent processing to form structures such as a partially vertical transistor, as shown in FIG. 4B. More specifically, FIG. 4B illustrates regions 44, 45 of the step 40 which have been doped to have a conductive state. The partially vertical transistor could be formed in a semiconductive substrate. Therefore, the region 46 would comprise semiconductor material. In operation, one electrical contact 41 would be connected to another electrical contact 42 by the application of voltage to a gate conductor region 43 adjacent the semiconductor 46. The voltage in the gate conductor region 43 would change the conductivity of the semiconductor region 46 from conductive to non-conductive or, alternatively, from non-conductive to conductive, to perform a switching operation.

Figure 5:
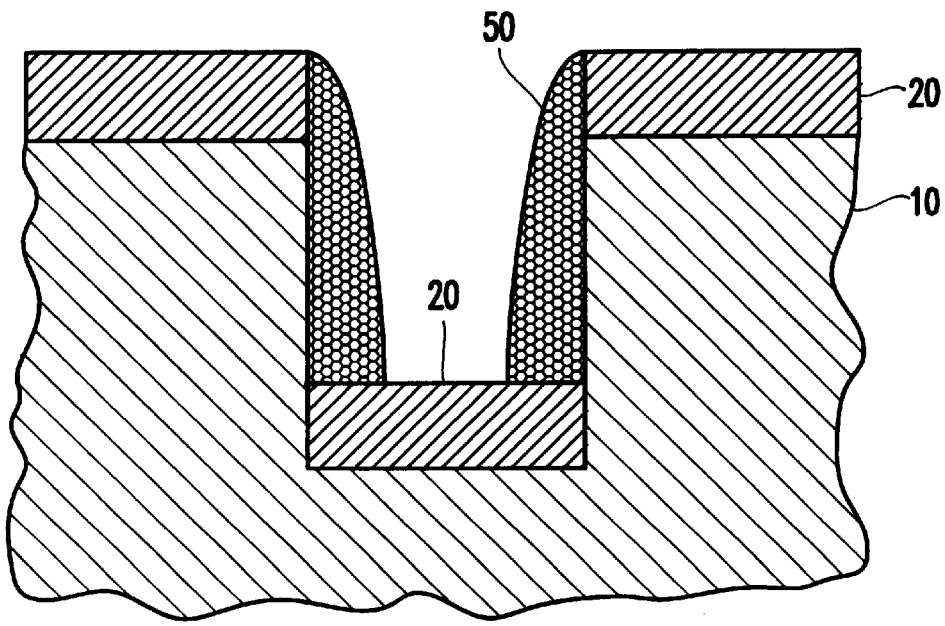
FIG. 5 is a schematic diagram of a partially formed structure according to the invention.

FIGS. 5–8 illustrate a second embodiment of the invention. More specifically, beginning with the structure shown in FIG. 2, spacers 50 are formed as shown in FIG. 5. The spacers can comprise any conventional material and are preferably formed of a material which can be selectively removed with respect to the substrate 10 and the mask 20. For example, the spacers can comprise SiN or polysilicon and are preferably formed of SiN. The spacers are generally formed by depositing the spacer material and subsequently removing the spacer material from horizontal surfaces using an anisotropic reactive ion etching (RIE) process which allows the material to remain only on vertical surfaces, thereby creating the spacers 50.

Figure 6:
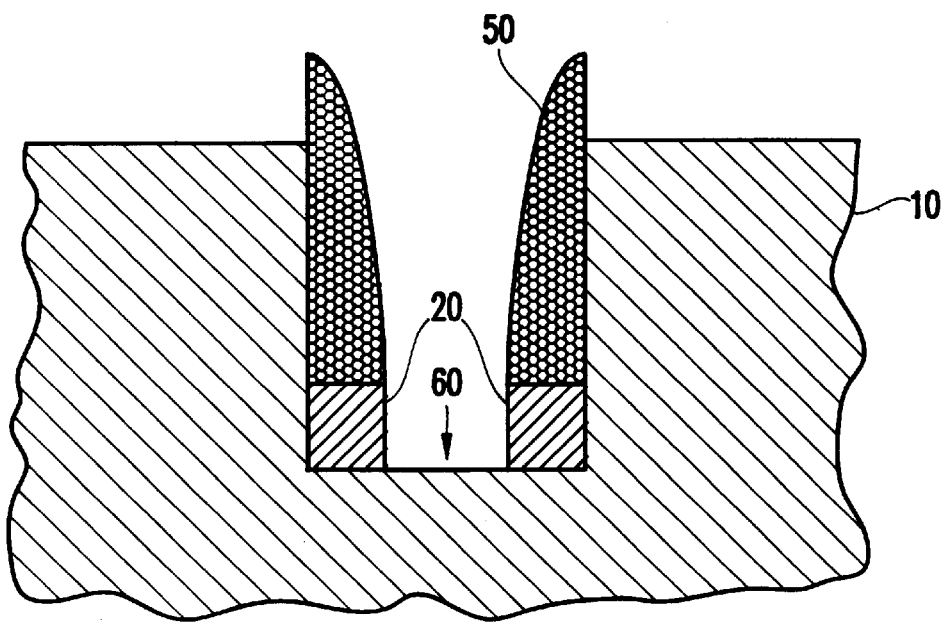
FIG. 6 is a schematic diagram of a partially formed structure according to the invention.
Figure 7:
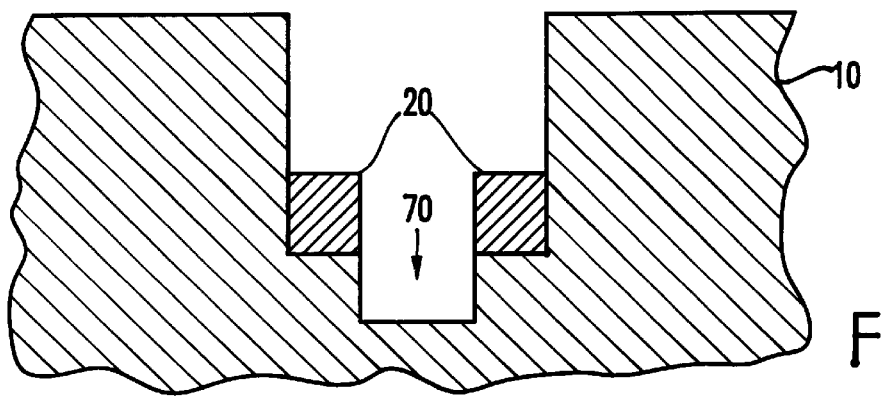
FIG 7 is a schematic diagram of a partially formed structure according to the invention.

A portion of the mask 20 within the opening 11 is removed as shown by item 60 in FIG. 6. This process also removes the mask 20 from other horizontal surfaces, except those areas protected by the spacers 50. For example, a reactive ion etch (RIE) which is selective to the mask material 20 (e.g., $CHF_3, CF_4, C_4F_8, O_2$, etc.) can be used to remove the mask material 20, without affecting the substrate 10, as shown in FIG. 6. The spacers 50 can then be removed and the substrate 10 can be etched further as shown by item 70 in FIG. 7 to extend the opening 60 below the level of the lowermost mask 20. Once again, a selective creative ion etching process (e.g., $NF_2$, HBr, or $O_2$) can be used to form the opening 70 without damaging the masks 20.

Figure 8:
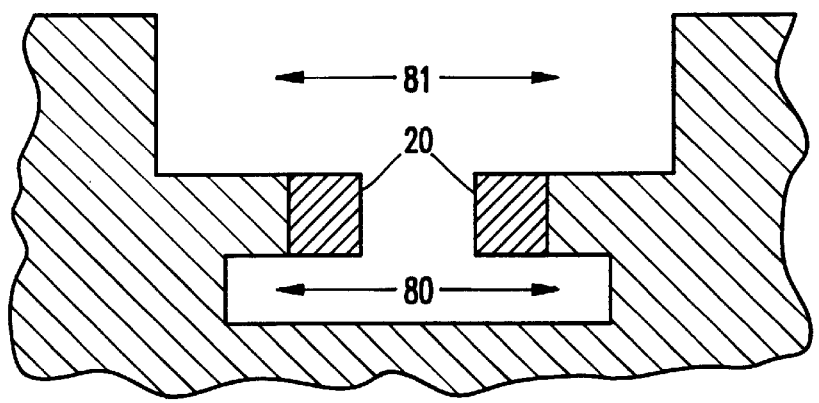
FIG. 8 is a schematic diagram of a partially formed structure according to the invention.

As shown in FIG. 8, the inventive lateral patterning process (discussed above) is used to form the openings 80, 81. The masks 20 can then be removed. The remaining structure is especially useful in low resistance buried bit-line formations and other similar applications.

Figures 9, 10:
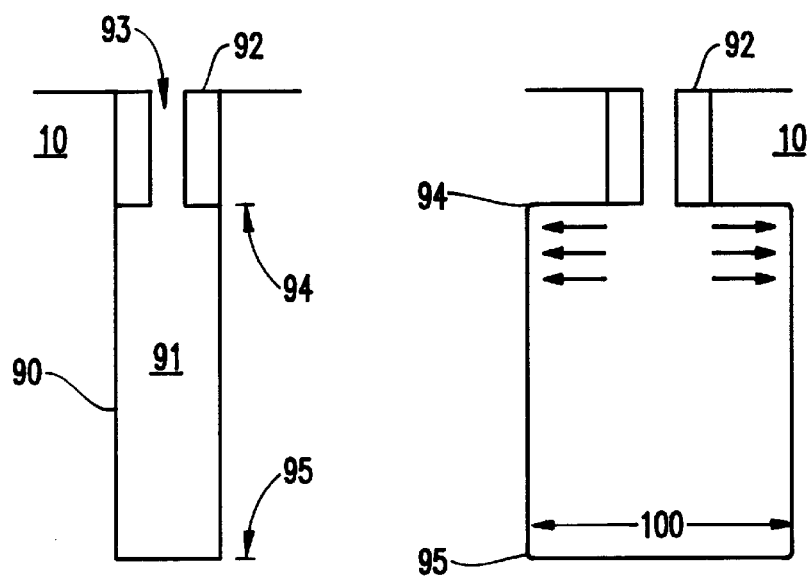
FIG. 9 is a schematic diagram of a partially formed structure according to the invention.
FIG. 10 is a schematic diagram of a structure according to the invention.

An alternative to the previous embodiment is shown in FIGS. 9–10. More specifically, in FIG. 9, a sacrificial material 91 (e.g., boro-silicate glass (BSG)) 91 and a mask 92 (e.g., tetraethylorthosilicate (TEOS)) are deposited in an opening 90 in the silicon 10. Then an opening 93 is formed in the mask 92, using conventional methods, such as those discussed above. The mask 92 stays in place during selective removal of the sacrificial material 91 from the bottom of the trench and the inventive lateral patterning process forms the opening 100 to complete a bottle shape for a bottle shaped capacitor storage trench shown in FIG. 10. After the opening 100 is formed, a node dielectric is formed by conventional means and the inner electrode is formed by conventional means. The structure is very useful for the subsequent formation of self-aligned bottle trench capacitor cells for DRAMs and other similar devices.

An important feature is that the upper portion 94 of the bottle opening 100 and the lower portion 95 of the bottle opening 100 are self-aligned by the inventive process. Further, the depth of the larger portion of the "bottle" is determined by the depth of the sacrificial material 91 within the opening 90, which is easily controlled by conventional deposition processing.

Figure 11:
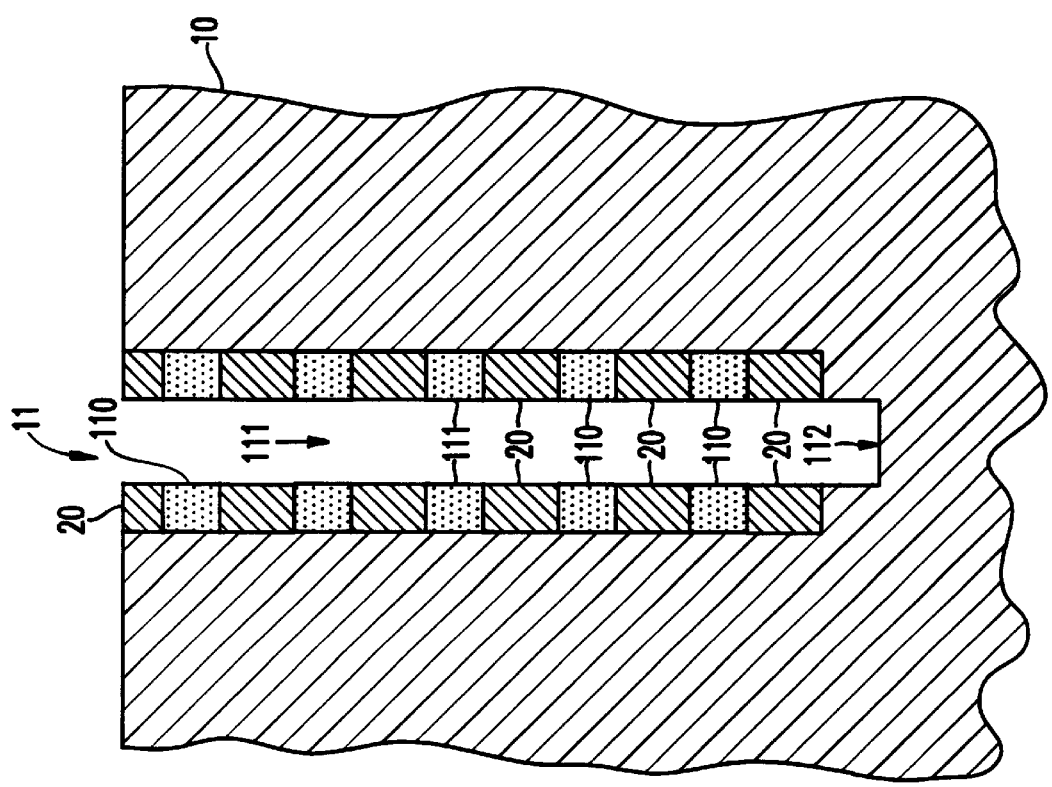
FIG. 11 is a schematic diagram of a partially formed structure according to the invention.

Another embodiment of the invention is shown in FIGS. 11–13C. In FIG. 11, the opening 11 within the substrate is filled with alternating layers of the mask material 20 and a sacrificial material 110 such as the boron silicate glass (BSG) mentioned above. More specifically, a small amount of the mask material 20 is deposited in the bottom of the opening 11, then a small amount of the sacrificial material 110 is deposited, then more of the mask material 20 followed by more of the sacrificial material 110 is deposited and the process is continued until the opening 11 is filled with alternating layers of mask material 20 and sacrificial material 110.

Then, an opening 111 is formed through the alternating layers and into the substrate 10 below the bottom most layer of mask material 20 (as indicated by item 112). The opening 111 is smaller than the opening 11 to allow the alternating layers to remain on the side walls of the opening 11. The sacrificial material 110 is then removed and the inventive lateral patterning process is used to create the lateral openings 120, as shown in FIG. 12A.

Figure 12A:
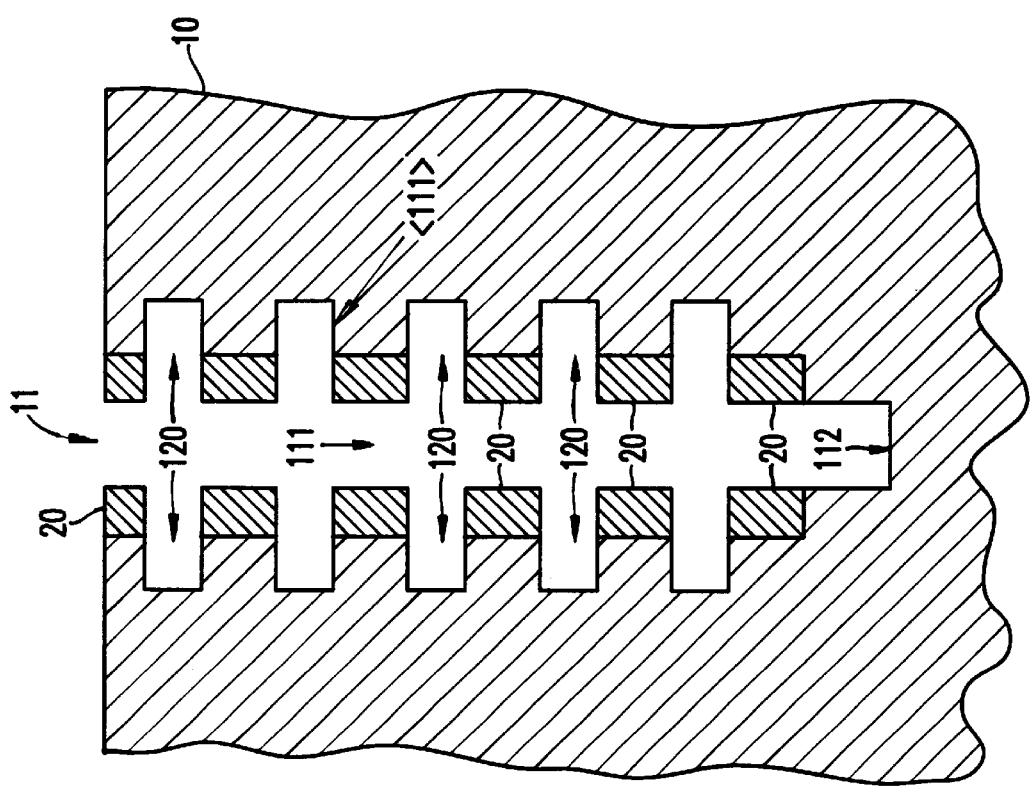
FIG. 12A is a schematic diagram of a partially formed structure according to the invention.
Figure 12C:
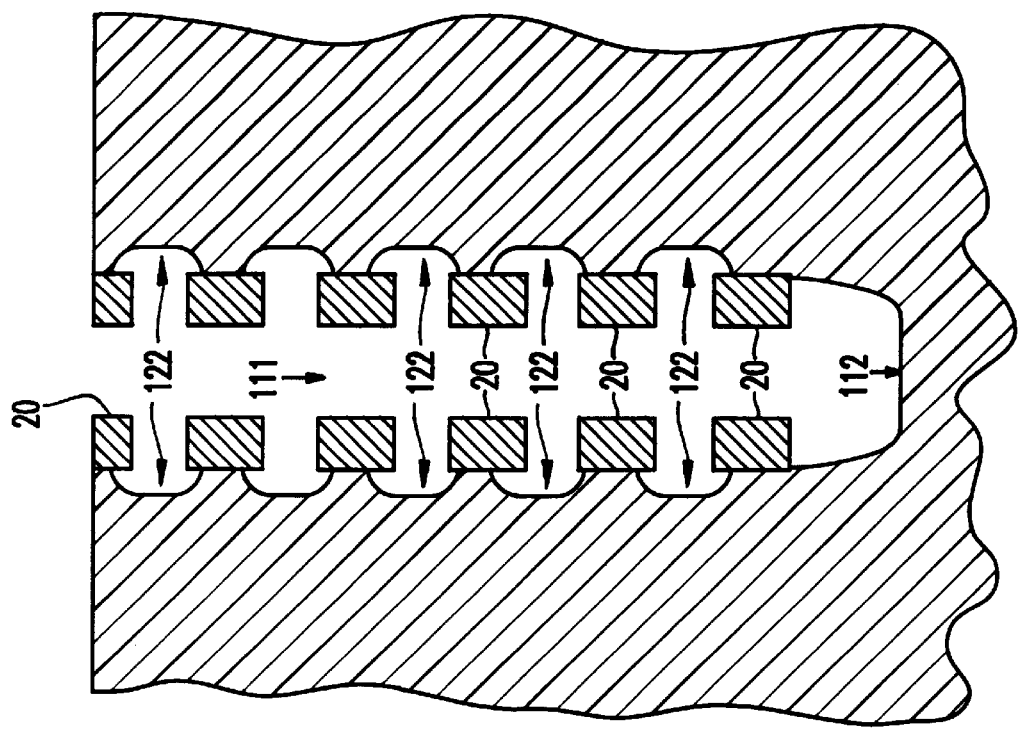
FIG. 12C is a schematic diagram of a partially formed structure according to the invention.

In FIG. 12A an isotopic etch is utilized to form the lateral openings 120 which are rectangular in cross-section. The openings 120 are rectangular in cross section because the structure is aligned with the <111> plane. To the contrary, the same isotopic etching produces the V-shaped openings 121 shown in FIG. 12B when the structure is aligned in the <100> plane. FIG. 12C illustrates another embodiment utilizing anisotopic etching which produces rounded lateral openings 122.

Figure 12B:
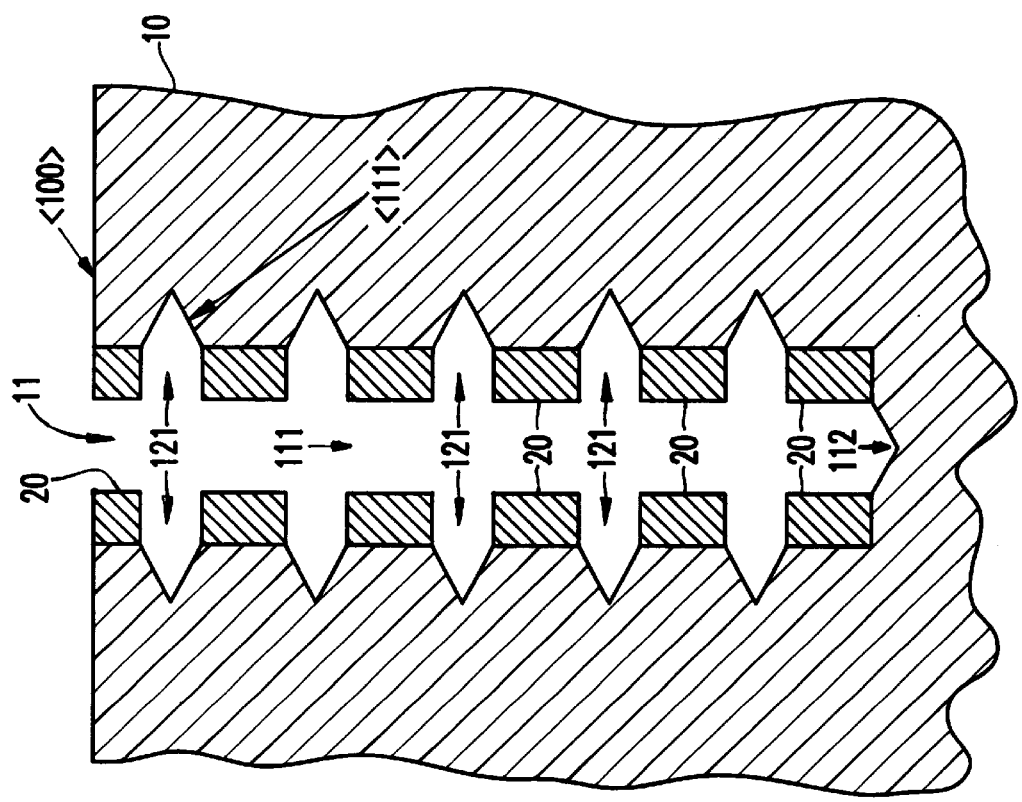
FIG. 12B is a schematic diagram of a partially formed structure according to the invention.
Figure 13B:
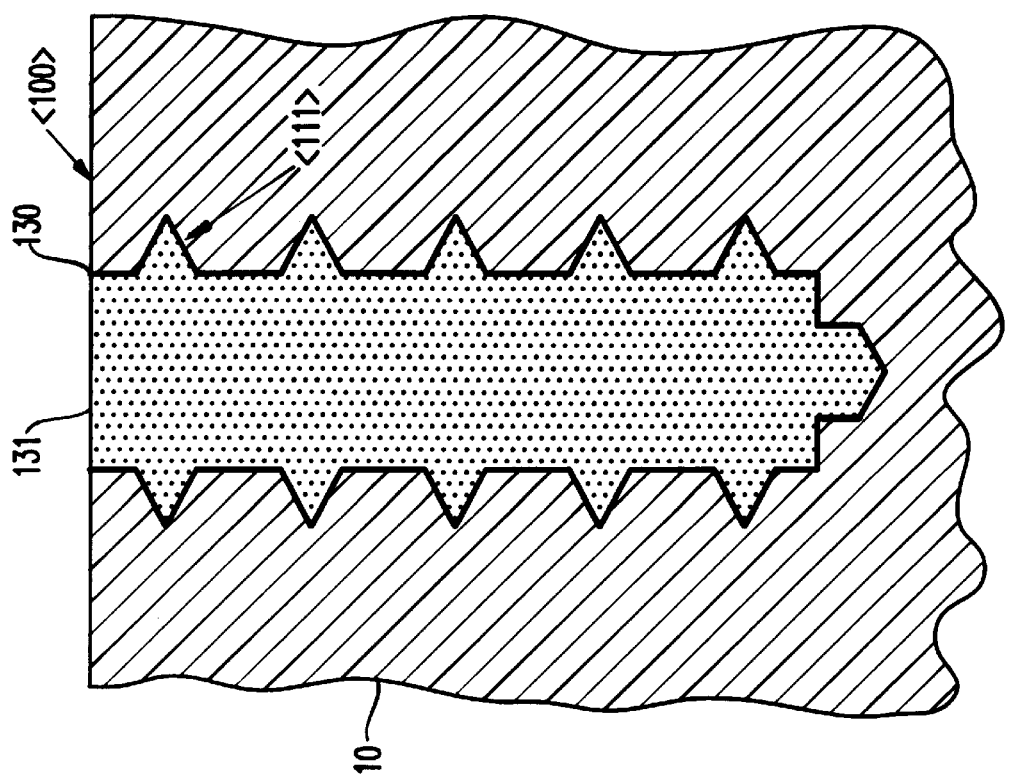
FIG. 13B is a schematic diagram of a deep trench capacitor structure according to the invention.
Figure 13A:
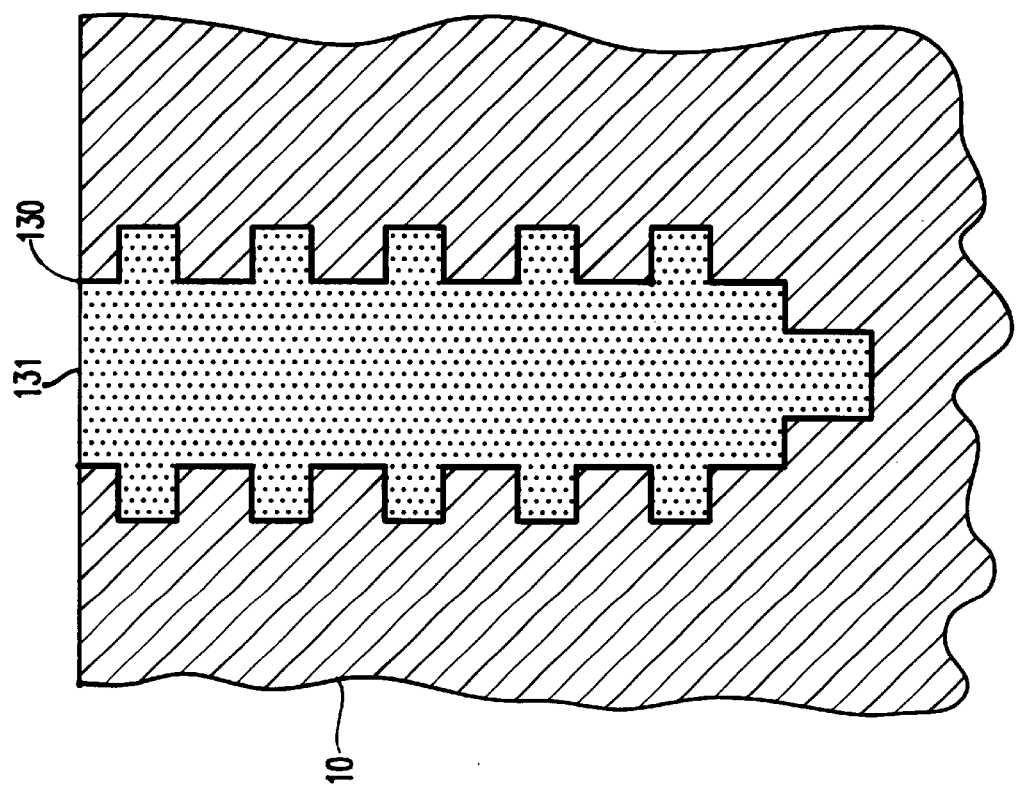
FIG. 13A is a schematic diagram of a deep trench capacitor structure according to the invention.
Figure 13C:
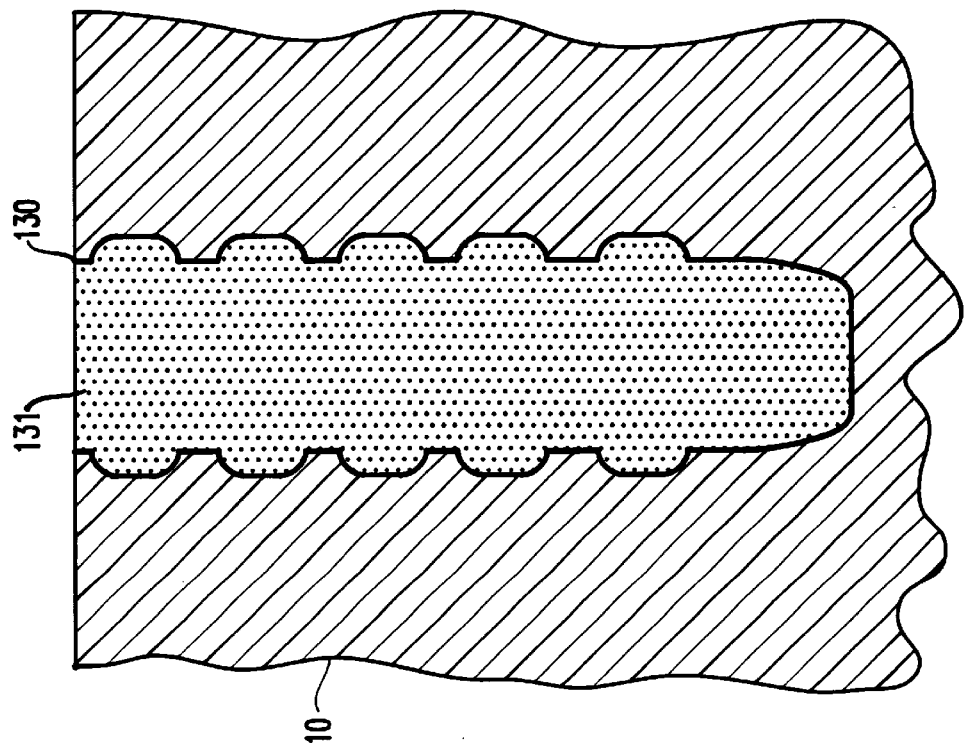
FIG. 13C is a schematic diagram of a deep trench capacitor structure according to the invention.

The structures shown in the FIGS. 12A, 12B, and 12C are extremely useful in forming deep trench devices that have increased capacitance. More specifically, as shown in FIGS. 13A, 13B, and 13C, the opening 111, 120–122 is lined with a thin insulator (e.g., an oxide or nitride) layer 130 as the dielectric of the capacitor and the remainder of the opening 111 is filled with a conductor 130 (e.g., metal, alloy, polysilicon, etc.) using well known conventional processes to form the inner electrode.

The structures formed according to the invention are superior to conventional structures. For example, the deep trench capacitor shown in FIGS. 13A, 13B, and 13C have a substantially increased surface area between the insulator 130 and the conductor 131 which produces a dramatic increase in the capacitance of the capacitor. Further, the remaining structures which can be formed using the inventive lateral patterning systems disclosed herein are advantageous over conventional structures because the self alignment is to the bottom of the initial trench. That results in a more uniform capacitance distribution.

Figure 15:
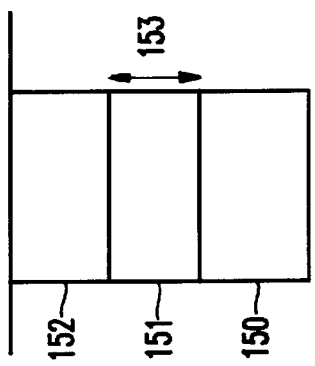
FIG. 15 is a schematic diagram of the next step in generation of vertical transistors according to the invention.
Figure 14:
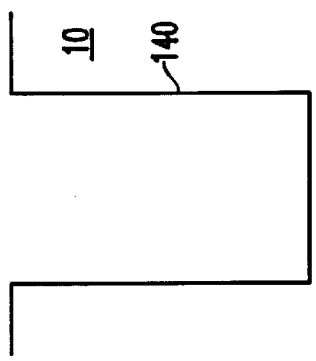
FIG 14 is a schematic diagram of the beginning of generation of vertical transistors according to the invention.
Figure 16:
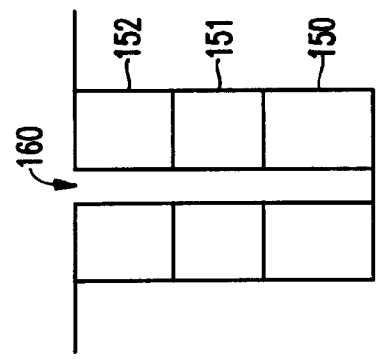
FIG. 16 is a schematic diagram of another step of generation of vertical transistors according to the invention.

FIGS. 14–21 illustrate one example of using the invention to form pairs of vertical transistors. More specifically, FIG. 14 illustrates an opening 140 in a substrate 10. In FIG. 15, the opening 140 is filled with alternating layers of mask material 150, 152 and sacrificial material 151 formed as discussed above. In FIG. 16, an opening 160 is formed through the layers 150–512 and in FIG. 17, the inventive lateral patterning process (e.g., the removal of the sacrificial material 151) produces an opening 171. The height of opening 171 is determined by the depth 153 of the layer of sacrificial material 151, as shown in FIG. 15, which, again, is easily controlled by conventional deposition processes.

Figure 17:
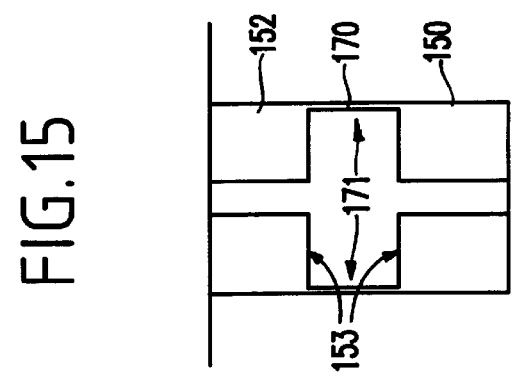
FIG. 17 is a schematic diagram of the next stage of generation of vertical transistors according to the invention.

In addition, in FIG. 17, a gate insulator 171 (e.g., oxide) can be formed along the sides of the opening. Then, in FIG. 18, the opening 160 is filled with a conductor 180, such as polysilicon, metal, alloy, etc. In FIG. 19, an opening 190 is formed to remove the conductor 180 from the center of the structure. This produces alternating layers of mask material 151, 152 and conductor 180. The mask material 151, 152 is then removed, as shown in FIG. 20, and the source and drain regions 201 are doped, using conventional methods. For example, the source/drain regions could be doped n+ or p+, $1E_2O/cm^3$ or higher, by diffusion or other well known methods.

An important feature of this embodiment is that the height 200 of the conductor 180 is determined by the deposition parameters of the sacrificial material 151. More specifically, the height 153, shown in FIG. 15 will control of the height 200 shown in FIG. 20. Therefore, the size of the conductor 180 is very easily controlled with the invention by simply altering the deposition parameters of the sacrificial material 151, as shown in FIG. 15.

In FIG. 21, the shallow trench isolation regions (STI) 210 are formed, as is well known in the art, to complete the transistor structure. Therefore, as shown in FIG. 21, the above process produces pairs of vertical transistors which have dimensions that are tightly controlled by the easily adjusted deposition process of the alternating mask and sacrificial material layers 150-152 shown in FIG. 15.

FIGS. 22–26 illustrate yet another example of how the invention can be used to improve the formation of electronic devices. More specifically, this embodiment forms a silicon trench which can be used, for example, to form a dual-gate transistor.

Figure 22:
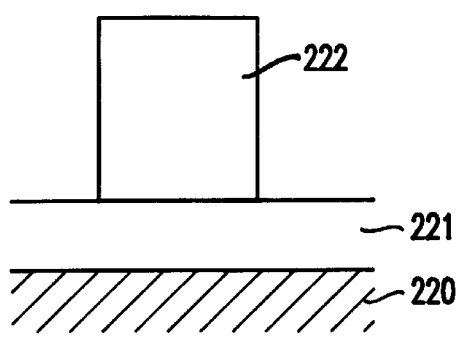
FIG. 22 is a schematic diagram of the first stage in the formation of a silicon bridge for a bridge device according to the invention.
Figure 23:
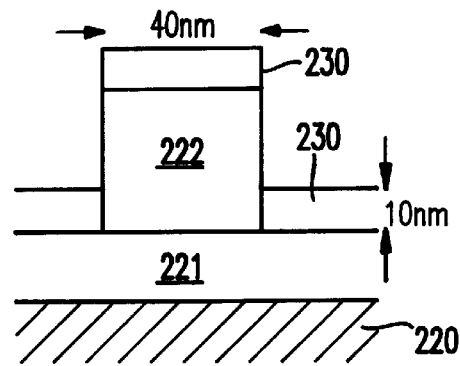
FIG. 23 is a schematic diagram of the second stage in the formation of a silicon bridge.
Figure 24:
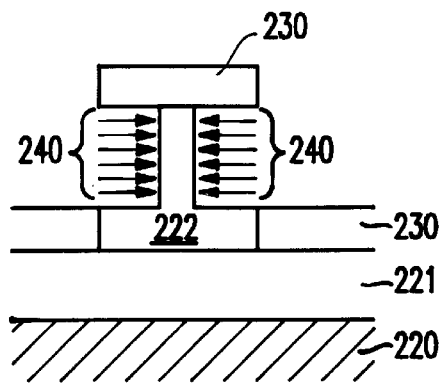
FIG 24 is a schematic diagram of the formation of a silicon bridge during lateral patterning according to the invention.
Figure 25:
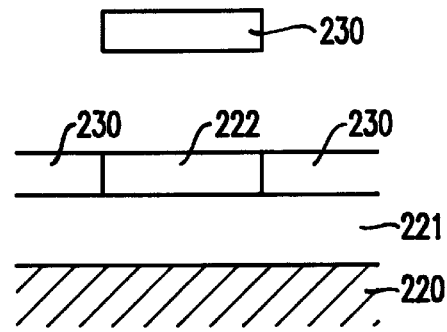
FIG. 25 is a schematic diagram of the formation of a silicon bridge after lateral patterning according to the invention.
Figure 26:
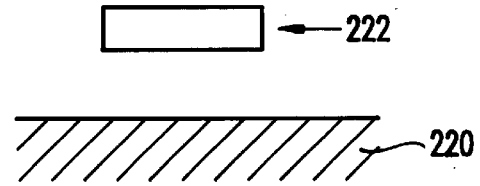
FIG. 26 is a schematic diagram of the free-standing silicon bridge device.

FIG. 22 illustrates a substrate 220 (such as a silicon substrate), and an insulator 221, such as many of the insulators discussed above, and a patterned structure 222, such as a silicon structure. In FIG. 23, a mask material 230 is formed along the horizontal surfaces using the processes described above. In FIG. 24, the material 222 is laterally patterned as shown by arrows 240 using the processes described above. As shown in FIG. 25 the lateral patterning process is continued to completely remove the exposed portion of the material 222. Then, as shown in FIG. 26, the insulator 221 and the mask 230 are removed to allow a suspended bridge of the material 222 to remain. A gate insulator can be formed on the suspended bridge and a gate conductor can then be formed around the bridge and the remaining well known processing can be performed to complete the dual gate transistor.

Figure 27:
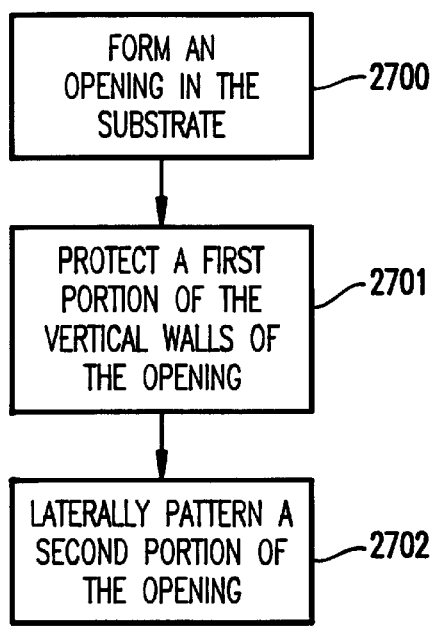
FIG. 27 is a flow diagram illustrating a preferred method of the invention.

FIG. 27 is a flow diagram of an embodiment of the invention. Item 2700 illustrates the forming of an opening 11 in the substrate 10. Item 2701 illustrates protecting a first portion of the vertical walls (mask) of the opening 11. Item 2702 illustrates the lateral patterning of a second portion 30 of the opening 11, as shown in FIGS. 1–3.

The inventive lateral patterning process is described above with respect to a few selected examples. However, the invention is not limited to the examples discussed. Instead, as would be known by one ordinarily skilled in the art given this disclosure, the invention is applicable to patterning and forming any structure which is subjected to conventional masking and patterning. The invention is superior to conventional formation techniques because it allows for self-aligned patterning in the third dimension (i.e., laterally). Also, the size of the structures can be easily adjusted by altering of the depth of the sacrificial and/or mask material, as discussed above. The depositions of the masking and sacrificial materials can be controlled much more precisely with the invention than with conventional lithographic techniques. This is especially true when the dimensions of the structures decrease.

While conventional lithographic techniques are optically limited to certain minimum features sizes, the inventive technique does not utilize optically patterned masks and can, therefore, produce structures which are smaller than those that can be produced using lithographic methods. Self-alignment is key in all high density integrated circuits and the invention opens the route for three-dimensional integration, since it allows for vertical self-alignment.

While the invention has been described in terms of preferred embodiments, those skilled in the art will recognize that the invention can be practiced with modification within the spirit and scope of the appended claims.

What is claimed is:

1. A method of forming an integrated circuit chip having at least one opening in a substrate, said method comprising:

forming an opening having vertical walls in said substrate;

protecting a first portion of said vertical walls of said opening, leaving a second portion of said vertical walls unprotected; and laterally patterning said second portion of said opening to change a property of said opening.

2. The method in claim 1, wherein said laterally patterning comprises one of an isotropic wet etch, an isotropic dry etch and an anisotropic wet etch.

3. The method in claim 1, wherein said protecting comprises forming a mask over said first portion of said vertical walls.

4. The method in claim 1, wherein said first portion comprises one of an upper and a lower portion of said opening.

5. The method in claim 1, wherein said first portion and said second portion comprises alternating portions along a length of said opening.

6. A method of forming an integrated circuit chip having at least one opening in a substrate, said method comprising:

forming an opening having vertical walls in said substrate;

protecting a first portion of said vertical walls of said opening, leaving a second portion of said vertical walls unprotected; and laterally patterning said second portion of said opening to form a step in said opening.

7. The method in claim 6, wherein said laterally patterning comprises one of an isotropic wet etch, an isotropic dry etch and an anisotropic wet etch.

8. The method in claim 6, wherein said protecting comprises forming a mask over said first portion of said vertical walls.

9. The method in claim 6, wherein said first portion comprises a lower portion of said opening.

10. The method in claim 6, wherein said substrate comprises a semiconductor and said method further comprises doping selected portions of said step to form two conductive regions separated by a semiconductive region, wherein in the presence of an adjacent voltage field, said semiconductive region changes its conductivity and performs a switching operation in combination with said conductive regions.

11. A method of forming an integrated circuit chip having at least one transistor, said method comprising:

forming an opening having vertical walls in a semiconductor substrate;

protecting a first portion of said vertical walls of said opening, leaving a second portion of said vertical walls unprotected;

laterally patterning said second portion of said opening to form a step in said opening; and doping selected portions of said step to form two conductive regions separated by a semiconductive region, wherein in the presence of an adjacent voltage field, said semiconductive region changes its conductivity and performs a switching operation in combination with said conductive regions.

12. The method in claim 11, wherein said laterally patterning comprises one of an isotropic wet etch, an isotropic dry etch and an anisotropic wet etch.

13. The method in claim 11, wherein said protecting comprises forming a mask over said first portion of said vertical walls.

14. The method in claim 11, wherein said first portion comprises a lower portion of said opening.

15. A method of forming an integrated circuit chip having at least one opening in a substrate, said method comprising:

forming an opening having vertical walls in said substrate;

protecting first portions of said vertical walls of said opening, leaving second portions of said vertical walls unprotected, wherein said first portions alternate with said second portions; and laterally patterning said second portions of said opening to change a property of said opening.

16. The method in claim 15, wherein said laterally patterning comprises one of an isotropic wet etch, an isotropic dry etch and an anisotropic wet etch.

17. The method in claim 15, wherein said protecting comprises forming a mask over said first portions of said vertical walls.

18. The method in claim 15, further comprising, after said laterally patterning, lining said opening with an insulator and filling a remainder of said opening with a conductor to form a deep trench capacitor.

19. The method in claim 15, further comprising, after said laterally patterning:

forming a gate insulator in said second portions;

forming a gate conductor over said gate insulator in said second portions;

doping said first portions to form source and drain regions; and forming isolation regions over said source and drain regions.

20. The method in claim 19, wherein said gate insulator, said gate conductor, said source and drain region sand said isolation regions comprise a vertical transistor.

* * * * *

UNITED STATES PATENT AND TRADEMARK OFFICE
CERTIFICATE OF CORRECTION

PATENT NO.    : 6,291,353 B1
DATED         : September 18, 2001
INVENTOR(S)   : Muller et al.

Page 1 of 1

It is certified that error appears in the above-identified patent and that said Letters Patent is hereby corrected as shown below:

<u>Column 4,</u>
Line 38, change "creative" to -- reactive --.

Signed and Sealed this

Twelfth Day of March, 2002

Attest:

*Attesting Officer*

JAMES E. ROGAN
*Director of the United States Patent and Trademark Office*